(12) United States Patent  
Otsuka et al.

(10) Patent No.: US 8,879,236 B2
(45) Date of Patent: *Nov. 4, 2014

(54) LAMINATED CERAMIC ELECTRONIC COMPONENT

(75) Inventors: Masahiro Otsuka, Nagaokakyo (JP); Koichi Banno, Nagaokakyo (JP); Akihiro Shiota, Nagaokakyo (JP); Shoichiro Suzuki, Nagaokakyo (JP); Taisuke Kanzaki, Nagaokakyo (JP); Masanori Nakamura, Nagaokakyo (JP)

(73) Assignee: Murata Manufacturing Co., Ltd., Nagaokakyo-Shi, Kyoto-fu (JP)

( * ) Notice: Subject to any disclaimer, the term of this patent is extended or adjusted under 35 U.S.C. 154(b) by 193 days.

This patent is subject to a terminal disclaimer.

(21) Appl. No.: 13/608,621

(22) Filed: Sep. 10, 2012

(65) Prior Publication Data

US 2012/0326559 A1 Dec. 27, 2012

Related U.S. Application Data

(63) Continuation of application No. PCT/JP2011/052526, filed on Feb. 7, 2011.

(30) Foreign Application Priority Data

Mar. 16, 2010 (JP) ................. 2010-059508

(51) Int. Cl.  
*H01G 4/228* (2006.01)  
*H01G 4/30* (2006.01)  
*H01G 4/008* (2006.01)  
*H01B 3/12* (2006.01)  
*H01G 4/12* (2006.01)  
*H01L 41/047* (2006.01)  
*H01L 41/187* (2006.01)

(52) U.S. Cl.  
CPC . *H01G 4/12* (2013.01); *H01G 4/30* (2013.01); *H01G 4/008* (2013.01); *H01B 3/12* (2013.01); *H01L 41/0471* (2013.01); *H01L 41/1876* (2013.01)  
USPC ............. 361/306.3; 361/301.2; 361/301.4; 361/306.1; 361/321.1; 361/321.2

(58) Field of Classification Search  
USPC ............... 361/306.3, 303–305, 306.1, 321.1, 361/321.2  
See application file for complete search history.

(56) References Cited

U.S. PATENT DOCUMENTS

2013/0002092 A1* 1/2013 Suzuki et al. ................. 310/311

FOREIGN PATENT DOCUMENTS

JP 60-013046 A 1/1985  
JP 04-312908 A 11/1992  
(Continued)

OTHER PUBLICATIONS

International Search Report and Written Opinion issued in PCT/JP2011/052526, mailed Apr. 26, 2011.

(Continued)

*Primary Examiner* — Nguyen T Ha  
(74) *Attorney, Agent, or Firm* — Dickstein Shapiro LLP

(57) ABSTRACT

Provided is a laminated ceramic electronic component having excellent mechanical characteristics, internal electrode corrosion resistance, high degree of freedom in ceramic material design, low cost, low defective rate, and various properties. The laminated ceramic electronic component includes: a laminate which has a plurality of laminated ceramic layers and internal electrodes at a plurality of specific interfaces between the ceramic layers and having an Al/Ni alloy as a component; and an external electrode formed on the outer surface of the laminate, wherein the Al/Ni ratio of the Al/Ni alloy is 85/15 or more.

19 Claims, 1 Drawing Sheet

(56) References Cited

FOREIGN PATENT DOCUMENTS

| JP | 06-084608 A | 3/1994 |
| JP | 2000-182880 A | 6/2000 |
| JP | 2005-039179 A | 2/2005 |

OTHER PUBLICATIONS

Japanese Office Action issued for corresponding application JP 2012-505562, date of dispatch Nov. 19, 2013 (English translation attached).

* cited by examiner

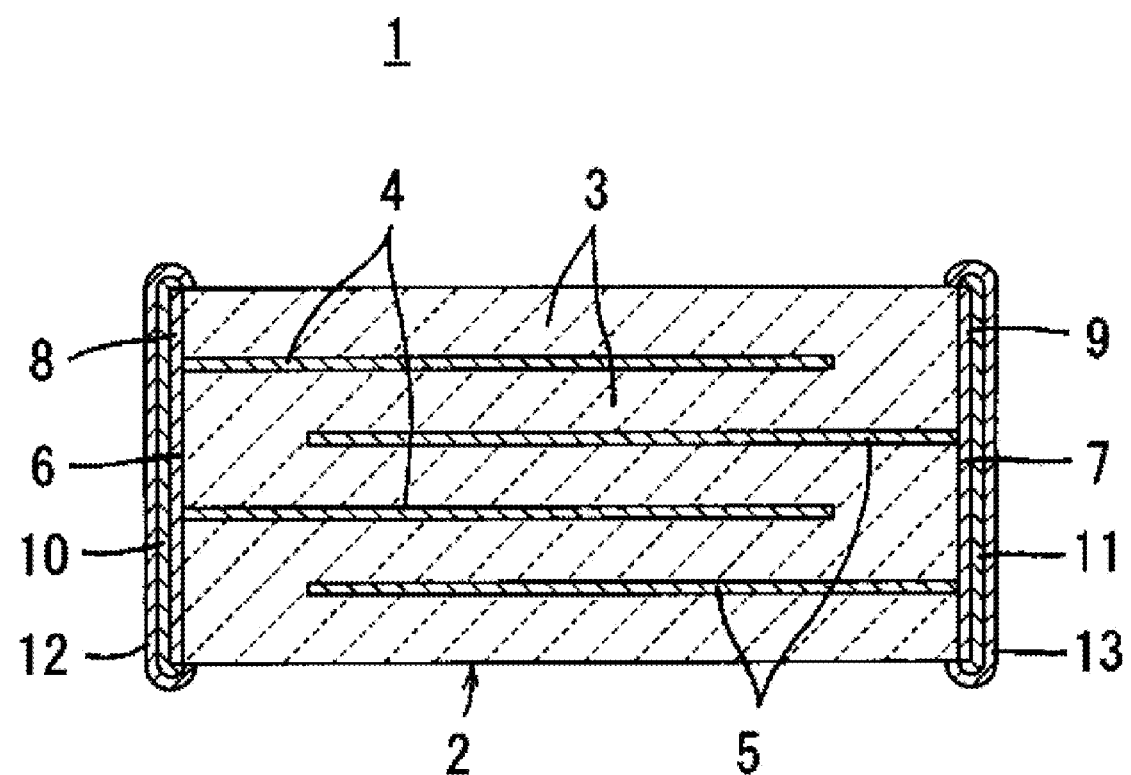

LAMINATED CERAMIC ELECTRONIC COMPONENT

This is a continuation of application Serial No. PCT/JP2011/052526, filed Feb. 7, 2011, the contents of which are incorporated herein by reference.

TECHNICAL FIELD

The present invention relates to a laminated ceramic electronic component, such as that represented by a laminated ceramic capacitor, and more particularly relates to one including an internal electrode having an Al alloy as a component.

BACKGROUND ART

A laminated ceramic electronic component according to the present invention will be first described with reference to FIG. 1 using a laminated ceramic capacitor 1 as an example.

The laminated ceramic capacitor 1 includes a laminate 2 having a plurality of internal electrodes 4 and 5 formed along specific interfaces between a plurality of laminated dielectric ceramic layers 3.

First and second external electrodes 6 and 7 are formed at different locations on the outer surface of the laminate 2. In the laminated ceramic capacitor 1 shown in FIG. 1, first and second external electrodes 6 and 7 are formed on opposite end surfaces of the laminate 2. Internal electrodes 4 and 5 include a plurality of first internal electrodes 4 electrically connected to the first external electrode 6 and a plurality of second internal electrodes 5 electrically connected to the second external electrode 7, and the first and second internal electrodes 4 and 5 are arranged alternately with respect to the laminating direction.

Various metal elements are conceivable for the internal electrode of the laminated ceramic electronic component, but base metals are often considered for the purpose of cost reduction.

Since base metals are very easily oxidized when co-fired with a ceramic, it has been necessary to have a reducing atmosphere during firing and precisely control the temperature and the oxygen partial pressure conditions. As a result, material design has been considerably limited. In addition, there have been concerns of delamination resulting from an uneven stress associated with co-firing, and so on.

In the case of using an internal electrode made of a base material alone, there has been concern about the corrosion resistance of the internal electrode if a ceramic laminate after being fired is exposed to a high-temperature and high-humidity environment.

For example, Patent Document 1 discloses a laminated ceramic electronic component using a base metal alloy as an internal electrode material. Specifically, the base metal alloy is a Ni/Al alloy and a Ti/Al alloy.

PRIOR ART PATENT DOCUMENT

Patent Document 1: JP 6-84608 A

DISCLOSURE OF THE INVENTION

Problem to be Solved by the Invention

In the laminated ceramic electronic component in Patent Document 1, the firing atmosphere is a nitrogen atmosphere, and therefore a re-oxidation treatment of a ceramic material is required, so that the process is complicated.

Further, the laminated ceramic electronic component in Patent Document 1 has the problem that a heavy stress is applied due to influences of shrinkage behaviors during temperature reduction during the firing process, and thus delamination easily occurs.

Thus, an object of the present invention is to provide a laminated ceramic electronic component including an internal electrode made of a base metal alloy, wherein mechanical troubles such as delamination are inhibited, and firing can be performed even in the air.

Means for Solving the Problem

The present invention is a laminated ceramic electronic component including: a laminate which has a plurality of laminated ceramic layers and a plurality of internal electrodes formed along specific interfaces between the ceramic layers and having an Al/Ni alloy as a component; and an external electrode formed on the outer surface of the laminate, wherein the Al/Ni ratio of the Al/Ni alloy is 85/15 or more.

Advantages of the Invention

According to the present invention, a laminated ceramic electronic component can be obtained in which occurrence of delamination is inhibited because stresses applied to ceramic layers from internal electrodes are low. In addition, a fixed amount of Ni is contained in the Al of the internal electrode to improve the corrosion resistance of the internal electrode, so that a laminated ceramic electronic component having high reliability even in a high-humidity environment can be obtained.

In addition, the laminated ceramic electronic component of the present invention is capable of being fired in the air although the internal electrode is made of a base metal, and therefore the degree of freedom in ceramic material design is improved. Accordingly, a laminated ceramic electronic component having various properties can be obtained.

BRIEF EXPLANATION OF DRAWING

FIG. 1 is a view showing a laminated ceramic capacitor that is an example of a laminated ceramic electronic component of the present invention.

BEST MODE FOR CARRYING OUT THE INVENTION

A laminated ceramic electronic component of the present invention has internal electrodes having an Al/Ni alloy as a main component. If the Al/Ni ratio is 85/15 or more, stress concentration between ceramic layers and internal electrodes is relieved, so that a delamination defect is effectively suppressed.

If the laminated ceramic electronic component of the present invention has an oxygen partial pressure of $1 \times 10^{-4}$ MPa or more (including the pressure of the air), the surface part of the internal electrode, i.e. a site contacting the ceramic layer, may be constituted by a layer having $Al_2O_3$ as a main component. This results principally from oxidation of the surface of the Al internal electrode. This $Al_2O_3$ layer prevents electrode breakage of the Al internal electrode, and keeps the conductivity of the Al internal electrode satisfactory. This $Al_2O_3$ layer also has an effect of smoothing the Al internal electrode layer. For exhibiting these effects, the thickness of $Al_2O_3$ layer is preferably 0.25% or more of the thickness of the internal electrode.

If the thickness of the $Al_2O_3$ layer is more than 10% of the thickness of the internal electrode, $Al_2O_3$ constitutes 20% of the total thickness of the internal electrode layer, and the improvement of the conductivity is compromised. Accordingly, the thickness of $Al_2O_3$ layer is preferably 10% or less of the thickness of the internal electrode.

A method for producing the laminated ceramic electronic component of the present invention will now be described using a laminated ceramic capacitor as an example.

First, a ceramic raw material is prepared. The ceramic raw material is mixed with an organic binder component, as required in a solvent, and thereby formed into a ceramic slurry. By sheet-molding the ceramic slurry, a ceramic green sheet is obtained.

Next, an internal electrode having an Al/Ni alloy as a main component is formed on the ceramic green sheet. There are several methods for achieving this, among which the method of screen-printing a conductive paste containing an Al/Ni alloy powder and an organic vehicle in a desired pattern is convenient. In addition, there are the method of transferring a metal foil and the method of forming an Al/Ni film while carrying out masking by a vacuum thin film formation method.

In this way, ceramic green sheets and internal electrode layers are stacked in multiple layers, and brought into close contact with one another under pressure to thereby a raw laminate before firing.

The raw laminate is fired in a kiln under predetermined atmosphere and temperature conditions. For example, if the oxygen partial pressure during firing is $1 \times 10^{-4}$ MPa or more and the firing temperature is 600° C. or more, oxidation of the surface of the internal electrode may proceed to form an $Al_2O_3$ layer having a moderate thickness. If the firing temperature is 1,000° C. or less, electrode breakage of the internal electrode is easily effectively prevented. Concerning the oxygen partial pressure, atmospheric pressure is most preferable when considering convenience of the process.

If the temperature increasing rate from room temperature to the maximum temperature in the firing process is 100° C./minute or more, an $Al_2O_3$ layer is easily formed on the surface of the internal electrode more reliably even though various changes, such as a change in ceramic material composition, occur.

It is to be noted that Al has a melting point of about 660° C., but it can be co-fired with a ceramic even at a temperature of 660° C. or more according to the production method of the present invention. This is ascribable to the $Al_2O_3$ layer formed on the surface part of the Al internal electrode. Thus, a high degree of freedom is also provided for material composition design of the ceramic used, and a variety of applications can be covered.

It is to be noted that the ceramic composition in the laminated ceramic electronic component of the present invention is not particularly limited. A variety of materials can be applied within the bounds of not impairing the object of the present invention, such as barium titanate-based materials (including those substituted with Ca, Sr, Zr and the like), lead titanate-based or lead zirconate titanate-based materials, alumina-based glass ceramics, ferrites and transition element oxide-based semiconductor ceramics.

The laminated ceramic electronic component of the present invention is applicable not only to a laminated ceramic capacitor, but also to a variety of electronic components such as a laminated piezoelectric element, a laminated thermistor element, a laminated chip coil and a ceramic multi-layered substrate.

Example

In this Example, the Al/Ni ratio in the internal electrode was changed, and the effects thereof on delamination were examined. Three ceramic materials having different compositions were prepared.

First, powders of $BaTiO_3$, $Bi_2O_3$ and CuO were prepared as a first ceramic material. These powders were mixed so as to satisfy the composition ratio described in "Material 1" in Table 1 to obtain a first ceramic raw material.

Similarly, a $(Pb_{0.88}Bi_{0.12})((Ni_{1/2}Nb_{1/2})_{0.15}Ti_{0.45}Zr_{0.40})O_3$ powder was prepared as a second ceramic material. This powder was the second ceramic raw material.

Similarly, powders of $BaTiO_3$, $Bi_2O_3$ and $B_2O_3$ were prepared as a third ceramic material. These powders were mixed so as to satisfy the composition ratio described in "Material 3" in Table 1 to obtain a third ceramic raw material.

An ethanol-based organic solvent and a polyvinyl butyral-based binder were added to each of these ceramic raw materials, and the resulting mixture was mixed in a wet process by a ball mill to obtain a ceramic slurry. The ceramic slurry was sheet-molded to obtain a ceramic green sheet.

An Al/Ni alloy powder with the Al/Ni ratio changed within a range of 99.9/0.1 to 80/20 as described in Table 1 was prepared. The alloy powder was mixed an acetate-based organic solvent and a cellulose-based binder to obtain an Al/Ni paste.

Next, an Al/Ni paste with the Al/Ni ratio within a range of 99.9/0.1 to 80/20 was coated on each of the three ceramic green sheets by screen printing to form an Al/Ni paste layer. Ceramic green sheets coated with the Al/Ni paste were laminated so as to be arranged alternately in terms of the side to which the Al/Ni paste layer extended, and brought into close contact with one another under pressure to obtain a raw laminate.

The raw laminate was heated in the air at 270° C. to remove the binder. Thereafter, the temperature was elevated at a temperature increasing rate of 100° C./minute, and the laminate was fired in the air at the firing temperature shown in Table 2. An Ag paste containing a BaO—$SiO_2$—BaO-based glass frit was coated on both end surfaces of the obtained laminate, and baked in the air at 600° C. to form an external electrode to be connected to the internal electrode.

A laminated ceramic electronic component thus obtained had a length of 2.0 mm, a width of 1.0 mm, a thickness of 1.0 mm, a thickness per ceramic layer of 15 μm, a thickness per internal electrode layer of 5 μm, and 30 effective layers contributing to an electrostatic capacity. The area of the portion confronted by the internal electrode per layer was $1.7 \times 10^{-6}$ $m^2$.

For each obtained sample, the electrostatic capacity and the dielectric loss (tan δ) were measured and found that it was practical as a laminated ceramic electronic component and there was no problem in conductivity of the internal electrode. A thin $Al_2O_3$ oxide film was formed on the surface of the internal electrode made of an Al/Ni alloy, and the smoothness and the continuity of the internal electrode were satisfactory.

For 30 of each sample obtained, the presence/absence of delamination was inspected by ultrasonic flaw detection. A sample in which any delamination at all could be observed was considered as a defective, and the number of such samples was shown in Table 1.

TABLE 1

| Material | Material composition | Al/Ni (atom) | Firing temperature [° C.] | Number of defectives |
|---|---|---|---|---|
| 1 | $90BaTiO_3 + 8Bi_2O_3 + 2CuO$ (mol %) | 99.9/0.1 | 800 | 0/30 |
|  |  | 99/1 | 800 | 0/30 |
|  |  | 98/2 | 800 | 0/30 |
|  |  | 95/5 | 800 | 0/30 |
|  |  | 90/10 | 800 | 0/30 |
|  |  | 85/15 | 800 | 0/30 |
|  |  | 80/20 | 800 | 5/30 |
| 2 | $(Pb_{0.88}Bi_{0.12})$ $((Ni_{1/2}Nb_{1/2})_{0.15}Ti_{0.45}Zr_{0.40})O_3$ | 99.9/0.1 | 850 | 0/30 |
|  |  | 99/1 | 850 | 0/30 |
|  |  | 98/2 | 850 | 0/30 |
|  |  | 95/5 | 850 | 0/30 |
|  |  | 90/10 | 850 | 0/30 |
|  |  | 85/15 | 850 | 0/30 |
|  |  | 80/20 | 850 | 15/30 |
| 3 | $50BaTiO_3 + 10B_2O_3 + 40Bi_2O_3$ (vol %) | 99.9/0.1 | 750 | 0/30 |
|  |  | 99/1 | 750 | 0/30 |
|  |  | 98/2 | 750 | 0/30 |
|  |  | 95/5 | 750 | 0/30 |
|  |  | 90/10 | 750 | 0/30 |
|  |  | 85/15 | 750 | 0/30 |
|  |  | 80/20 | 750 | 7/30 |

It can be seen from the results in Table 1 that the number of delamination defectives was 0 in samples when the Al/Ni ratio in the internal electrode satisfied 99.9/0.1 to 85/15 in laminated ceramic capacitors using the three ceramic materials described above. On the other hand, a delamination defect occurred for samples having an Al/Ni ratio of less than 85/15.

INDUSTRIAL APPLICABILITY

A laminated ceramic electronic component of the present invention is applicable for a laminated ceramic capacitor, a laminated piezoelectric element, a laminated thermistor, a laminated chip coil, a ceramic multi-layered substrate, and the like.

The invention claimed is:

1. A laminated ceramic electronic component comprising a laminate comprising a plurality of laminated ceramic layers and Al/Ni alloy-containing internal electrodes at a plurality of specific interfaces between ceramic layers, wherein the Al/Ni atomic ratio in the Al/Ni alloy is 85/15 or more.

2. The laminated ceramic electronic component according to claim 1, wherein at least one internal electrode has a layer of $Al_2O_3$ on its surface.

3. The laminated ceramic electronic component according to claim 2, wherein the $Al_2O_3$ constitutes 0.25% to 10% of the thickness of the internal electrode.

4. The laminated ceramic electronic component according to claim 3, wherein the ceramic comprises a titanate, zirconate, glass ceramic, ferrite or transition element oxide ceramic.

5. The laminated ceramic electronic component according to claim 4, further comprising at least one external electrode on an outer surface of the laminate.

6. The laminated ceramic electronic component according to claim 3, further comprising at least one external electrode on an outer surface of the laminate.

7. The laminated ceramic electronic component according to claim 2, further comprising at least one external electrode on an outer surface of the laminate.

8. The laminated ceramic electronic component according to claim 1, further comprising at least one external electrode on an outer surface of the laminate.

9. The laminated ceramic electronic component according to claim 1, wherein the Al/Ni atomic ratio in the Al/Ni alloy is 90/10 to 99.9/0.1.

10. The laminated ceramic electronic component according to claim 9, wherein at least one internal electrode has a layer of $Al_2O_3$ on its surface.

11. The laminated ceramic electronic component according to claim 10, wherein the $Al_2O_3$ constitutes 0.25% to 10% of the thickness of the internal electrode.

12. The laminated ceramic electronic component according to claim 1, wherein the ceramic layer comprises a barium titanate-based perovskite compound, and the laminated ceramic electronic component is a laminated ceramic capacitor.

13. The laminated ceramic electronic component according to claim 12, further comprising at least one external electrode on an outer surface of the laminate.

14. The laminated ceramic electronic component according to claim 13, wherein at least one internal electrode has a layer of $Al_2O_3$ on its surface.

15. The laminated ceramic electronic component according to claim 14, wherein the $Al_2O_3$ constitutes 0.25% to 10% of the thickness of the internal electrode.

16. The laminated ceramic electronic component according to claim 1, wherein the ceramic layer comprises a lead zirconate titanate-based perovskite compound, and the laminated ceramic electronic component is a laminated piezoelectric element.

17. The laminated ceramic electronic component according to claim 16, further comprising at least one external electrode on an outer surface of the laminate.

18. The laminated ceramic electronic component according to claim 17, wherein at least one internal electrode has a layer of $Al_2O_3$ on its surface.

19. The laminated ceramic electronic component according to claim 18, wherein the $Al_2O_3$ constitutes 0.25% to 10% of the thickness of the internal electrode.

* * * * *